US011679980B2

(12) United States Patent
Kanatzidis et al.

(10) Patent No.: US 11,679,980 B2
(45) Date of Patent: Jun. 20, 2023

(54) LITHIUM-CONTAINING CHALCOPHOSPHATES FOR THERMAL NEUTRON DETECTION

(71) Applicants: Northwestern University, Evanston, IL (US); UChicago Argonne, LLC, Chicago, IL (US)

(72) Inventors: Mercouri G. Kanatzidis, Wilmette, IL (US); Daniel G. Chica, Evanston, IL (US); Yihui He, Evanston, IL (US); Duck Young Chung, Bolingbrook, IL (US)

(73) Assignees: Northwestern University, Evanston, IL (US); UChicago Argonne, LLC, Chicago, IL (US)

( * ) Notice: Subject to any disclaimer, the term of this patent is extended or adjusted under 35 U.S.C. 154(b) by 245 days.

(21) Appl. No.: 17/252,776

(22) PCT Filed: Jun. 19, 2019

(86) PCT No.: PCT/US2019/037859
§ 371 (c)(1),
(2) Date: Dec. 16, 2020

(87) PCT Pub. No.: WO2019/246172
PCT Pub. Date: Dec. 26, 2019

(65) Prior Publication Data
US 2021/0206638 A1 Jul. 8, 2021

Related U.S. Application Data

(60) Provisional application No. 62/701,144, filed on Jul. 20, 2018, provisional application No. 62/687,430, filed on Jun. 20, 2018.

(51) Int. Cl.
*C01B 25/14* (2006.01)
*C30B 23/00* (2006.01)
(Continued)

(52) U.S. Cl.
CPC .............. *C01B 25/14* (2013.01); *C30B 23/00* (2013.01); *C30B 29/46* (2013.01); *G01T 1/24* (2013.01); *G01T 3/08* (2013.01)

(58) Field of Classification Search
CPC .......... C01B 25/14; C30B 23/00; C30B 29/46
See application file for complete search history.

(56) References Cited

U.S. PATENT DOCUMENTS 7,034,307 B2 4/2006 Sane et al.
8,519,347 B2 8/2013 Kanatzidis et al.
(Continued)

OTHER PUBLICATIONS

Kuhn, et al. publication entitled "Synthesis and crystal structures of alkali aluminum thiohypodiphosphates MAlP2S6 (M = Li, Na)," Zeitschrift fur Anorganische und Allgemeine Chemia, vol. 639. No. 7, Jun. 2013. (Year: 2013).*
(Continued)

*Primary Examiner* — Hugh Maupin
(74) *Attorney, Agent, or Firm* — Bell & Manning, LLC

(57) ABSTRACT

Inorganic compounds having the formula $LiMP_2Q_6$, where M is Ga, In, Bi, Sb, As, Al, or a combination thereof, and Q is S and/or Se, are provided. Methods and devices for detecting incident neutrons and alpha-particles using the compounds are also provided. For thermal neutron detection applications, the compounds can be enriched with lithium-6 isotope ($^6Li$) to enhance their neutron detecting capabilities.

8 Claims, 11 Drawing Sheets

(51) Int. Cl.
*C30B 29/46* (2006.01)
*G01T 1/24* (2006.01)
*G01T 3/08* (2006.01)

(56) References Cited

U.S. PATENT DOCUMENTS

| | | | |
|---|---|---|---|
| 9,334,581 | B2 | 5/2016 | Stowe et al. |
| 9,632,190 | B2 | 4/2017 | Stowe et al. |
| 10,472,249 | B2 | 11/2019 | Kanatzidis et al. |
| 2010/0292065 | A1 | 11/2010 | Kanatzidis et al. |
| 2018/0164447 | A1 | 6/2018 | Kanatzidis et al. |

OTHER PUBLICATIONS

Indika U. Arachchige et al., "Mercouri G. Kanatzidis : Excellence and Innovations in Inorganic and Solid-State Chemistry," *Inorg. Chem.* 2017, vol. 56; pp. 7582-7597.

A Maity et al., "Hexagonal Boron nitride neutron detectors with high detection efficiencies," Journal of *Applied Physics* 123, pp. 044501-01-044501-8 (2018).

E. Tupitsyn et al., "Lithium containing chalcogenide single crystals for neutron detection," *Journal of Crystal Growth* 393 (2014), pp. 23-27.

Mercouri G. Kanatzidis, "New directions in synthetic solid-state chemistry: chalcophosphate salt fluxes for discovery of new multinary solids," Current opinion in Solid State & Materials Science 1997, vol. 2; pp. 139-149.

Jennifer A. Aitken et al., "LiEuPSe4 and KEuPSe4: Novel Selenophosphates with the Tetrahedral [PSe4]3- Building Block," *Inorg. Chem.* 2000, vol. 39; pp. 1525-1533.

The International Search Report and the Written Opinion dated Aug. 27, 2019 for International Application No. PCT/US19/37859; pp. 1-9.

Kuhn et al., Synthesis and crystal structures of alkali aluminium thiohypodiphospates MAlP2S6 (M=Li, Na). Zeitschrift fur Anorganische and und Allgemeine Chemia, vol. 639, No. 7, Jun. 4, 2013; abstract; p. 1, col. 1, second paragraph; p. 1, col. 2, table 1; p. 2, col. 1, first third paragraphs.

Paul M. Johns, "Materials development for nuclear security: Bismuth triiodide room temperature semiconductor detectors," University of Florida, a dissertation, 2017, [Retrieved from the internet on Aug. 1, 2019], ,URL: https://ufdc.ufl.edu/UFE0050880/0000.; p. 57, figure 1-13; p. 62, second Paragraph; p. 63, first paragraph; p. 64, second paragraph; p. 65, first paragraph; p. 105, second paragraph; p. 334, first paragraph; p. 335, table E-3; p. 337, second paragraph.

K. Kishio et al., "Phase stability of doped b-LiAl, *Materials Science and Engineering*," vol. 49, No. 1; pp. 1-6, Jun. 1981; abstract; p. 1, col. 2, first paragraph.

A. J. Downs, "Chemistry of aluminium, gallium, indium and thallium," Spring Science & Business Media, May 31, 1993; p. 224, first paragraph.

* cited by examiner

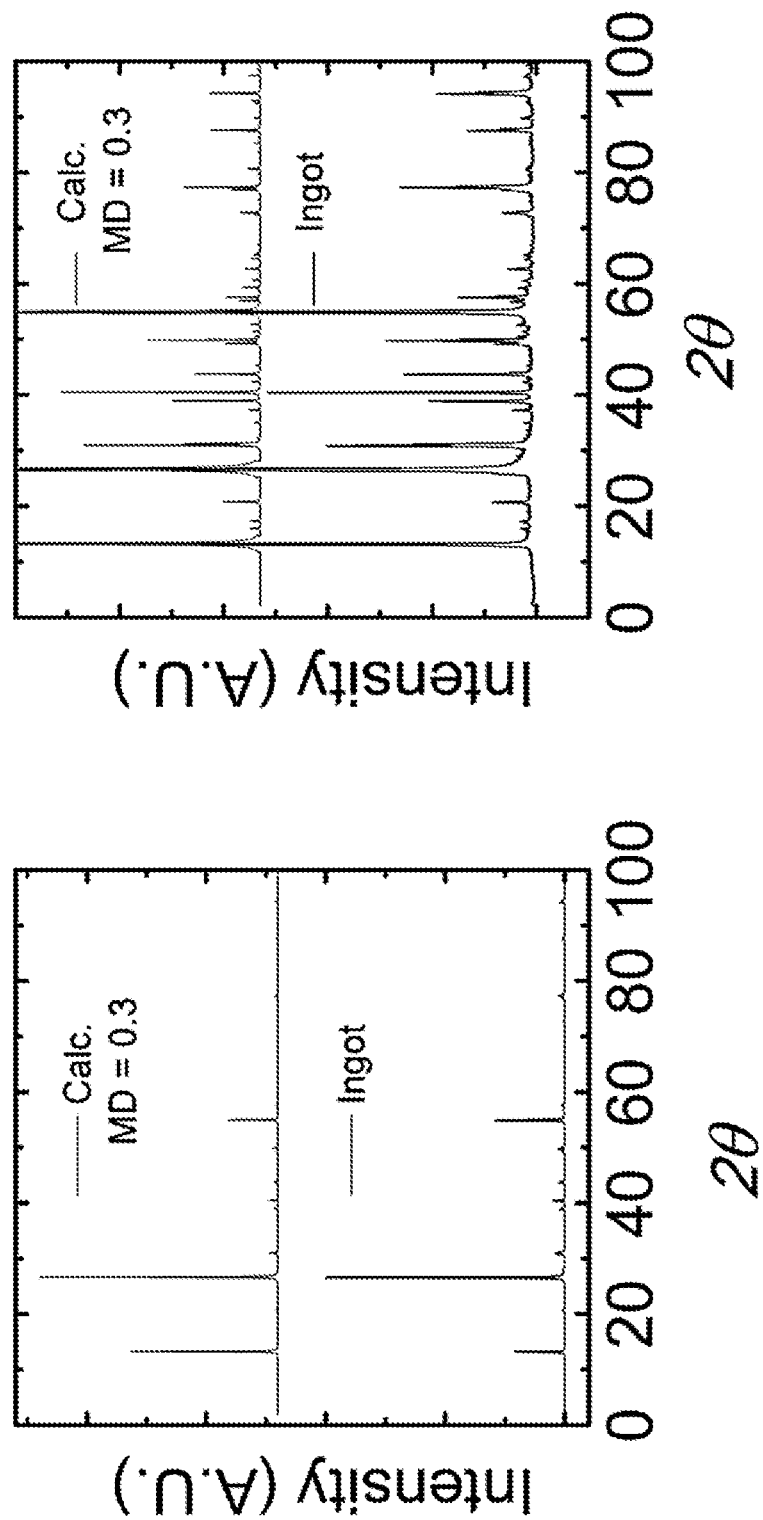

LITHIUM-CONTAINING CHALCOPHOSPHATES FOR THERMAL NEUTRON DETECTION

CROSS-REFERENCE TO RELATED APPLICATIONS

This application is a National Stage of International Application No. PCT/US19/37859, filed Jun. 19, 2019, which claims the benefit of U.S. Patent Application No. 62/687,430, filed Jun. 20, 2018, and U.S. Patent Application No. 62/701,144, filed Jul. 20, 2018, the contents of which are herein incorporated by reference.

REFERENCE TO GOVERNMENT RIGHTS

This invention was made with government support under 2016-123-R2 awarded by the Department of Energy. The government has certain rights in the invention.

BACKGROUND

Highly efficient neutron detectors are demanded in several sectors spanning national security, medicine, and astronomy. One of the greatest demands for neutron detectors stems from large portal detectors at border crossings to prevent the smuggling of radioactive material used to make dirty bombs. The most common detector for thermal neutron detection is the $^3$He-filled proportional counter, the success of which can be attributed to its thermal neutron capture cross section (5330 barns), high energy reaction products (Q value=0.764 MeV), low atomic number facilitating gamma ray discrimination, and chemical inertness. However, in the past two decades, the stockpile of $^3$He has been greatly depleted, with no viable means for replenishment. Therefore, there exists an increasing interest in developing new candidate materials for thermal neutron detection to replace $^3$He tubes.

Neutron detection based on Li or B containing semiconductors is an emerging technology that promises highly efficient detectors. The two classes of semiconductors for neutron detection include indirect and direct conversion. Indirect conversion semiconductors comprise a thin region of neutron sensitive material in conjunction with a well-developed semiconductor (e.g., Si). Incident neutrons are captured in the neutron sensitive region, forming high-energy products that create carriers in the semiconducting region which are then collected. The efficiency of these devices relies on the degree of energy transfer from the neutron capture to the semiconducting region. Sophisticated nanostructuring is required to prevent self-absorption in the neutron capture region, which adds to the cost of production. For direct conversion semiconductors, the neutron capture and semiconducting regions are combined into a single volume. This combination allows for sufficient collection of almost all the carriers created from neutron absorption and enables a simple detector geometry demonstrating a clear advantage over indirect conversion devices. Two leading materials based on direct conversion include LiInSe$_2$ and h-BN. The crystal growth of LiInSe$_2$ is quite challenging because of the high reactivity of lithium with crucible materials at temperatures needed for single-crystal growth (m.p.~915° C.). Consequently, evaporative loss of lithium and selenium occurs, resulting in a high concentration of defects. Intrinsic defects caused by off-stoichiometry during crystal growth cause the absorption below the band edge to vary from 2.10 eV to 2.85 eV. Charge collection efficiency (CCE) is lowered accordingly for the more red-shifted samples.

SUMMARY

Crystalline lithium chalcophosphates, methods and devices for detecting incident neutrons and alpha-particles using the lithium chalcophosphates, and methods for making the lithium chalcophosphates are provided.

The lithium-containing chalcophosphate compounds have the formula LiMP$_2$Q$_6$, where M is Ga, In, Bi, Sb, As, Al, or a combination thereof, and Q is S, Se, or a combination thereof. In some embodiments, the lithium is isotopically enriched with the lithium-6 isotope and/or the compounds are extrinsically doped.

One embodiment of a method for detecting thermal neutrons includes the steps of: applying an electric field across a single-crystal of a lithium-containing chalcophosphate compound having the formula LiMP$_2$Q$_6$, where M is Ga, In, Bi, Sb, As, Al, or a combination thereof, and Q is S, Se, or a combination thereof; exposing the single-crystal to incident neutrons, wherein the single-crystal absorbs incident neutrons, resulting in the generation of an electrical signal; and detecting the electrical signal.

One embodiment of a method of making a single-crystal of an inorganic compound having the formula LiMP$_2$Q$_6$, where M is Ga, In, Bi, Sb, As, Al, or a combination thereof, and Q is S, S, Te, or a combination thereof, includes the steps of growing the single-crystal via chemical vapor transport growth in the presence of a transport agent. Another embodiment of a method of making a single-crystal of an inorganic compound having the formula LiMP$_2$Q$_6$, where M is Ga, In, Bi, Sb, As, Al, or a combination thereof, and Q is S, Se, or a combination thereof, includes the step of growing the single-crystal via the solidification of a melt containing each element of the compound.

BRIEF DESCRIPTION OF THE DRAWINGS

Illustrative embodiments of the invention will hereafter be described with reference to the accompanying drawings, wherein like numerals denote like elements.

FIG. 3A depicts the experimental vs. simulated diffraction pattern of LiInP$_2$Se$_6$ scaled to the largest peak. FIG. 3B shows the experimental vs. simulated diffraction pattern of LiInP$_2$Se$_6$ scaled by a factor of 20. The simulated pattern has a March-Dollase (MD) parameter of 0.3.

DETAILED DESCRIPTION

Figures 1A, 1B:
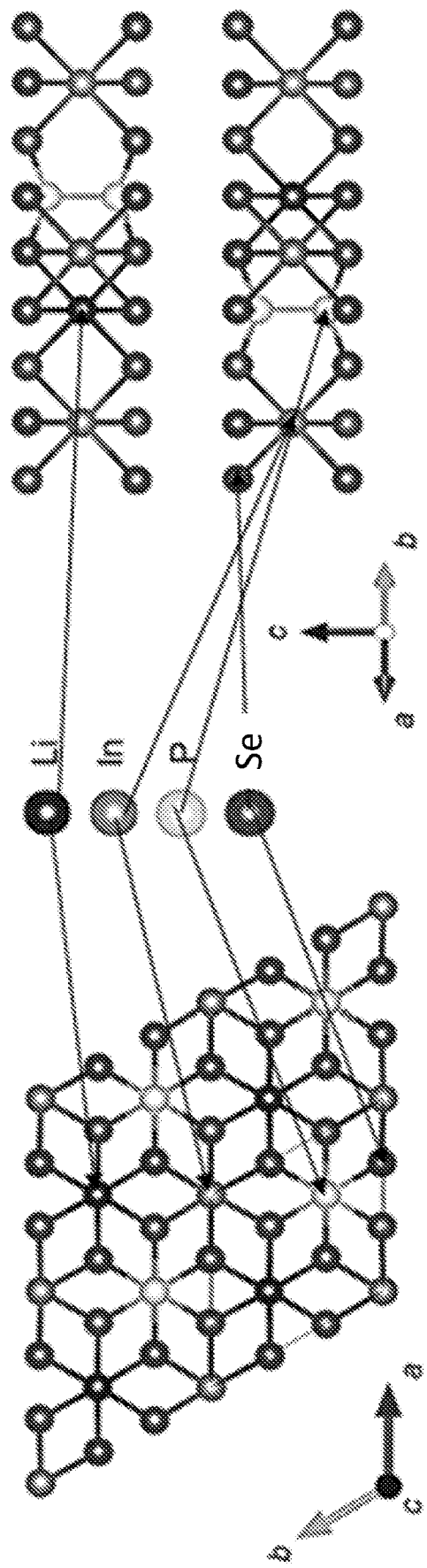
FIG. 1A depicts the crystal structure of LiInP$_2$Se$_6$ as a 2×2 unit cell looking down the c-axis.
FIG. 1B depicts a single unit cell looking down the ab-axis, showing a layered structure.

Inorganic compounds having the formula LiMP$_2$Q$_6$, where M is Ga, In, Bi. Sb, As, Al, or a combination thereof, and Q is S, Se, or a combination thereof, are provided. Methods and devices for detecting incident neutrons and alpha-particles using the compounds are also provided. For thermal neutron detection applications, the compounds can be enriched with the lithium-6 isotope, relative to the natural abundance of the lithium-6 isotope, to enhance their neutron detecting capabilities. This isotopically enriched lithium is designated $^6$Li.

As used herein, the terms enriched isotopic abundance and isotopically enriched mean that the relative abundance of at least one isotope of the element has been enriched relative to the natural abundance of that isotope in that element. For example, selenium that is isotopically enriched in its 76-isotope, relative to the abundance of the 76-isotope in naturally occurring selenium, is designated $^{76}$Se. Some embodiments of the materials are made using a combination of lithium having a natural isotopic abundance and isotopically enriched lithium.

Some embodiments of the inorganic compounds are doped with extrinsic dopants to increase the performance of lithium containing chalcophosphates. Extrinsic dopants include F, Cl, Br, I, S, Se, Te, As, Sb, Si, Ge, Sn, Pb, Al, Ga, In, Tl, Zn, Cd, Hg, Cu, Ag, Mn, and Na. The doped compounds include LiInP$_2$Se$_6$ doped with Cd to improve its hole carrier transport. As used herein, the term doping refers to the intentional addition of small amounts of an 'impurity' element that does not change the structure of crystal structure of the most compound material. By way of illustration, a dopant atom can substitute for the M element in the LiMP$_2$Q$_6$ lattice without changing the crystal structure of the material or a dopant element can substitute for the lithium in the LiMP$_2$Q$_6$ lattice without changing the crystal structure of the material. Typical dopant concentrations in the doped compounds are 5 mol. % or lower, including 2 mol. % or lower, and 1 mol. % or lower (e.g., in the range from about 0.001 mol. % to 1 mol. %). In contrast, at higher concentrations of an additional M element, alloying occurs. Alloying involves the formation of solid solution of two or more elements. Unlike doping, alloying can change the crystal structure of the host compound material. For the purposes of this disclosure, an LiMP$_2$Q$_6$ compound that is referred to as comprising "a combination of" M elements refers to an alloyed compound. Thus, an LiMP$_2$Q$_6$ compound that includes two alloyed M elements would be considered a quinary compound, rather than a doped quaternary compound.

Crystalline, detector-grade materials comprising the compounds can be grown with high chemical purity and high crystal quality. The crystals can be grown via slow solidification from a melt comprising the elements making up the compounds. Methods of making detector-grade single-crystal materials include Bridgman growth and CVT growth from bulk lithium-containing chalcophosphates. Example 1 illustrates the CVT growth of large single-crystals of LiInP$_2$Se$_6$ in a simple two-zone temperature furnace. However, the CVT methods described in Example 1 can be adapted to make other detector-grade lithium-containing chalcophosphates by employing other known lithium and phosphorus chalcogenide precursors under the same or similar reaction conditions. Although Example 1 uses binary precursors (e.g., Li$_2$Se and P$_2$Se$_5$), the compounds can also be synthesized from elementary elements. During CVT growth of the single-crystals, transport agents are added to achieve the transport. Suitable transport agents include iodine, bromine, chlorine, InI$_3$, InBr$_3$, and InCl$_3$. Optionally, once crystals of the chalcophosphates have been synthesized, they can undergo surface processing, such as mechanical polishing and/or chemical etching, to obtain smooth and defect-free surfaces. However, post synthetic cutting and/or polishing is not required to make high-quality, planar crystals with highly uniform thicknesses.

Some embodiments of the single-crystals have a thickness of at least 0.5 mm. This includes embodiments of the single-crystals having a thickness of at least 1 mm. Some embodiments of the single-crystals have a width and/or length of at least 0.5 cm. This includes embodiments of the single-crystals having a width and/or length of at least 1 cm. For the purpose of measuring the dimensions of a single-crystal, the length can be determined by the longest lateral dimension of the crystal, and the width can be determined by the longest lateral dimension running perpendicular to the length dimension. The thickness of the crystal is the transverse dimension running orthogonal to the length and width dimensions.

The lithium-containing chalcophosphates have high electrical resistivities. For example, LiInP$_2$Se$_6$ crystals having a resistivity at 23° C. of at least 1×10$^{13}$ Ω·cm can be formed. This includes LiInP$_2$Se$_6$ crystals having a resistivity at 23° C. in the range from 1×10$^{13}$ Ω·cm to 1×10$^{14}$ Ω·cm. In addition, LiInP$_2$Se$_6$ crystals having photocurrent/dark current ratios of at least 1000 can be synthesized. This includes LiInP$_2$Se$_6$ crystals having photocurrent/dark current ratios in the range from 1000 to 10,000. Methods of determining the electrical resistivity and the photocurrent/dark current ratio of a material are described in Example 1. The very high resistivity of the compounds enables the use of large ara detectors and high applied voltages, allowing for increased efficiency and gamma ray discrimination. In addition, the use of relatively low atomic number (Z) elements in the compounds decreases the chance of gamma ray absorption, which can lead to false counts during signal detection.

One aspect of the invention provides direct-conversion solid state neutron detectors. In some embodiments, the neutron detectors include: a material comprising a lithium-containing chalcophosphate of one or more of the types described herein; a first electrode in electrical communication with the material; a second electrode in electrical communication with the material, wherein the first and second electrodes are configured to apply an electric field across the material; and a detector configured to measure an electrical signal generated by electron-hole pairs that are formed when the material is exposed to incident thermal neutrons. In these neutron detectors, the lithium in the chalcophosphate compounds absorbs incident neutrons, generating highly energetic charged particles (e.g., alpha-particles) that deposit their energies in the material, creating the electron and holes which give rise to the electrical signal when an electric field is applied across the material.

The chalcophosphate compounds also can be used for direct alpha-particle detection. One embodiment of an alpha-particle detector includes: a material comprising a lithium-containing chalcophosphate of one or more of the types described herein; a first electrode in electrical communication with the material; a second electrode in electrical communication with the material, wherein the first and second electrodes are configured to apply an electric field across the material; and a detector configured to measure a signal generated by electron-hole pairs that are formed when the material is exposed to incident alpha-particles.

In the detectors, the electrodes can comprise a metal, for example, Au, Pt, Pd, In, Ni, and/or Ti, or a combination of two or more thereof. Suitable electrodes include, but are not limited to, planar symmetrical type electrodes and planar unsymmetrical type electrodes, which can be used with the flat single-crystals of the lithium-containing chalcophosphate compounds to fabricate planar detectors.

Arrays comprising a plurality of the detectors on a substrate can be provided to form a detector array. Because single-crystals of the compounds can grow in uniform single-crystal plates, they are well suited for use in pixel arrays, which allow for the spatially resolved neutron detection needed in neutron imaging applications. The neutron detectors and arrays of the neutron detectors may further include electronics operable for measuring the electrical signal from the detectors and for generating spatially and/or time-resolved images of the neutrons incident upon the detector crystals. Similarly, the alpha-particle detectors and arrays of the alpha-particle detectors may further include electronics operable for measuring the electrical signal from the detectors and for generating spatially and/or time-resolved images of the alpha-particles incident upon the detector crystals.

Unless otherwise indicated herein, the values for measured or measurable quantities refer to the value of those quantities at room temperature (~23° C.) and pressure (~1 atm).

EXAMPLES

Example 1

This example reports the crystal growth and physical properties of the lithium-containing semiconductor, $LiInP_2Se_6$, belonging to the layered selenophosphate family. The CVT method was employed for growth of single-crystals with large areas (e.g., ~1 cm$^2$) and moderate thicknesses (e.g., 0.05-1 mm). $LiInP_2Se_6$ exhibited extremely low dark current and thus high electrical resistivity, high photo-conductivity, and high air stability. This material can resolve the energy peak of $^{241}$Am alpha-particles, indicating its usefulness for neutron detection.

Experimental

Chemical Reagents.

Li (99.9% Sigma Aldrich), In (99.99% American elements), P (99.999% Alfa Aesar), Se (99.99% American elements), and $I_2$ (99.999% Sigma Aldrich) were used as received.

Synthesis of $Li_2Se$, $P_2Se_5$, and Bulk $LiInP_2Se_6$.

$Li_2Se$ was synthesized using the following modified literature procedure: In a nitrogen filled glovebox, lithium metal was removed from mineral oil, and the oxidized edges were cut off. The metal was weighed and loaded swiftly into the reaction vessel to minimize oxidation of the surface by nitrogen. Selenium was added afterward. In a typical reaction, 15 g of material was synthesized with the Li:Se ratio of 2:1.002. The slight excess of selenium was to ensure the reaction went to completion. Moderate stirring was employed with a glass stir bar to speed up the reaction. Argonne gas was flowed into the reaction vessel to prevent lithium oxidation. The reaction was run until the ammonia turned from a deep blue to a faint, clear, orange color. After the completion of the reaction, the liquid ammonia was boiled off, and the vessel was placed under vacuum overnight. The material was stored in an $N_2$ glovebox.

For $P_2Se_6$, red phosphorus pieces (1.356 g) and selenium shot (8.6437 g) were loaded into 13-mm fused silica tubes in a stoichiometric ratio. The tubes were flame sealed under vacuum (~2×10 mbar). The reagents were physically mixed by shaking the tubes. The tubes were placed in a tilted tube furnace such that the tops of the tubes were at the center of the furnace. The following temperature profile was used: Heat to 500° C. in 12 hours, hold temperature for 72 hours, and furnace cool to ambient temperature. The tubes were opened in a nitrogen-filled glovebox for storage. Due to the air sensitive nature of $Li_2Se$, the reagents were manipulated in a nitrogen-filled glovebox. For the bulk synthesis of $LiInP_2Se_6$, $Li_2Se$ (0.437 g), In (1.030 g), $P_2Se_5$ (4.181 g), and Se (0.351 g) were loaded into a carbon coated, 13-mm fused silica tube corresponding to the molar ratio, Li/In/P/Se=1.05/1/2.04/6.12. Synthesis of chalcogenides containing Li typically requires crucibles that can withstand chemical attack from Li, such as glassy carbon or pyrolytic boron nitride (BN). In the present synthesis, the tubes were carbon coated to prevent glass attack, this was successful, as only trace amounts of this attack were seen. The tubes were flame sealed under vacuum (~2×10$^{-3}$ mbar). The tubes and thermocouple were placed in the same manner as in the reaction of $P_2Se_5$. The following optimized heating profile was used: Heat to 750° C. in 10 hours, hold temperature for 24 hours, cool to 350° C. in 12 hours, and then furnace cool to ambient temperature. The tubes were opened in air, revealing an ingot comprising deep red plates.

CVT.

Preformed material from the bulk synthesis was used as the source of $LiInP_2Se_6$. Approximately 0.5-5 g of material was combined with 16-80 mg of $I_2$; the amount used depended on the inner diameter (13-18 mm). The tube was sealed to a length of 17 cm while the bottom was submerged in liquid nitrogen to prevent loss of iodine. The tube was then placed in a two-zone furnace and subjected to the following heating profile: Source zone—Heat to 560° C. in 6 hours; hold temperature for 12 hours: heat to 660° C. in 6 hours; hold for 168 hours; cool to ambient temperature in 6 hours. Sink zone—Heat to 660° C. in 6 hours: hold for 12 hours; heat to 560° C. in 6 hours; hold for 170 hours; cool to ambient temperature in 10 hours. After the transport process, deep red plates were found on the sink side, and the source material was consumed. The vacuum of the tube was breached by slowly cutting into the tube at the source side with a diamond saw and making a pin hole opening. This step was necessary to prevent damage to the thinner crystals from the influx of air.

X-Ray Diffraction (XRD).

A Rigaku Miniflex600 equipped with a Dtex silicon 1-D detector was used to obtain powder XRD patterns. Cu Kα radiation (λ=1.5406 Å) was produced using 40 kV and 15 mA and filtered with a graphite monochromator and Kβ foil filter. A zero-background silicon holder was used. Crystals suitable for single-crystal diffraction were obtained using CVT reactions. Single-crystal XRD was performed using a STOE IPDS II operating at 50 kV and 40 mA with Mo Kα radiation (λ=0.71073 Å) with graphite monochromatizer. Data reduction, integration, and absorption correction were performed using the X-area software package. XPREP was used to determine the space group and prepare data for the structure solution. Structure solutions using intrinsic phasing and refinements were obtained using SHELXT and SHELXL, respectively. (See, e.g., Sheldrick, G. M., Research Papers SHELXT—Integrated Space-Group and Crystal-Structure Determination Research Papers. 2014, 3-8; and Sheldrick, G. M., Crystal Structure Refinement with SHELXL. 2014, No. Md, 3-8.)

Optical Properties Characterization.

UV-Vis transmission and reflection were measured on a PerkinElmer LAMBDA 1050 UV/Vis Spectrophotometer in the range of 1500 to 250 nm on a single-crystal of $LiInP_2Se_6$ at room temperature. These were used to obtain the absorption and thereby determine the bandgap via a linear fit of a Tauc plot.

Differential Thermal Analysis (DTA).

For the determination of thermal properties, a Netzch Simultaneous Thermal Analysis (STA 449F3) instrument was employed. Approximately 25 mg of sample was sealed in a fused silica ampoule. An ampoule of alumina of similar mass was used as a reference. The heating and cooling rate were 10 K/min.

SEM.

A Hitachi 3400 scanning electron microscope was used to image the microstructure. The accelerating voltage and probe current were set to 20 keV and 70 mA, respectively. Energy dispersive X-ray spectroscopy (EDS) was performed using a PGT energy dispersive X-ray analyzer.

Device Fabrication.

Planar-type devices were fabricated using single-crystals grown from CVT. Translucent and flat crystals that were visibly defect-free were selected. Gold electrodes with a typical area of 3×3 mm$^2$ and thicknesses of 70-100 nm were prepared on both sides by thermal evaporation at a rate of ~1 Å/sec using an SQC-310 Inficon deposition controller. Cu wire and graphite paste were then used for the connection of gold electrodes with the external circuit for the following physical properties measurement.

Electrical Properties and α-Particle Response.

The electrical resistivity was measured using a Keithley 6517B electrometer. For dark current measurements, the device was enclosed in a light, tight metal box. The photoconductivity was measured using ambient light as the source of excitation. I-V characteristic curves from 100 to −100V were used to calculate the electrical resistivity. Samples were typically measured from 100 to −100 V to determine the resistivity. To enable collection of the α-particle spectrum, planar-type detectors with evaporated gold contacts were used for pulse height spectroscopy. The α-particle source employed in this example was an $^{241}$Am α-particle source with a typical kinetic energy of 5.49 eV. The detectors were enclosed in a metal box with an $^{241}$Am alpha-particle source ~3 mm away from the top electrode. The device was connected to an eV-550 preamplifier and a voltage source that applied 20-1000V to the bottom electrode. An ORTEC amplifier (model 572A) was used to amplify and shape the signal from the preamplifier. The gain and shaping times were set to 100-200 and 0.5-2 μs, respectively. A dual 16K input multichannel (Model ASPEC-927) and MAESTRO-32 software were used to analyze the amplified signal and display the response spectrum, respectively.

Results and Discussion

The crystal structure of $LiInP_2Se_6$ was solved in the trigonal space group, P-31c with lattice parameters a=b=6.3968 Å, c=13.3503 Å, α=β=90°, and, γ=120°. Detailed information of the structure and refinement is listed in Table 1. $LiInP_2Se_6$ is comprised of polyhedral thick layers separated by van der Waals gaps. The individual layer possesses the $CdI_2$ structure prototype, where Li. In, and $P_2$ dimers each occupy ⅓ of the Cd sites in an ordered manner, and Se occupies the I site illustrated in FIG. 1A. The stacking of these layers follows an ABAB-sequence. Along the c axis, the $InSe_6$ polyhera align, while the $LiSe_6$ and $P_2Se_6$ polyhedra alternate (FIG. 1B). The individual coordination environments of Li and In are triangular antiprismatic, while P has a tetrahedral environment. There are several metal selenophosphates isostructural to $LiInP_2Se_6$ with the general formula $MM'P_2Se_6$, where M=Cu, Ag occupies the Li site, M'=In, Ga, Sb, and RE occupies the In site. (See, e.g., Pfeiff, R., Quaternary Selenodiphosphates (IV): M~MIII [P2Se 6], (M I=Cu, Ag; Mm=Cr, Al, Ga, In). 1992, 186, 111-133; and Seidlmayer, S., Strukturchemische Untersuchungen an Hexachalkogenohypodiphosphaten Und Verwandten Verbindungen, University of Regensburg, 2009.) The bismuth analogues have a more complex stacking sequence even though the structure of the individual layers is the same, i.e., the individual layer has the same ordering of 1+ and 3+ metals cations. For $CuBiP_2Se_6$, the driving force for the complex stacking stems from ferroelectric ordering that occurs as the temperature lowers. (See. e.g., Gave. M. A., et al., *Inorg. Chem.* 2005, 44 (15), 5293-5303.) The structure at T=298K is isostructural to $LiInP_2Se_6$, except Cu and Bi occupy the In and Li sites, respectively. As the temperature is lowered, the unit cell increases to six layers, then twelve layers. The room temperature phase for $AgBiP_2Se_6$ is isostructural to the six-layer $CuBiP_2Se_6$.

TABLE 1

Crystal data and structure refinement for $LiInP_2Se_6$ at 293 K.

| | |
|---|---|
| Empirical formula | $LiInP_2Se_6$ |
| Formula weight | 657.46 |
| Temperature | 293 K |
| Wavelength | 0.71073 Å |
| Crystal system | Trigonal |
| Space group | P-31c |
| Unit cell dimensions | a = 6.3971(4) Å, α = 90° |
| | b = 6.3971(4) Å, β = 90° |
| | c = 13.3505(12) Å, γ = 120° |
| Volume | 473.15(7) Å$^3$ |
| Z | 2 |
| Density (calculated) | 4.615 g/cm$^3$ |
| Absorption coefficient | 25.832 mm$^{-1}$ |
| F(000) | 572 |
| Crystal size | 0.4 × 0.2 × 0.05 mm$^3$ |
| θ range for data collection | 3.052 to 29.197° |
| Index ranges | −8 <= h <= 8, −8 <= k <= 8, −17 <= l <= 18 |
| Reflections collected | 4045 |

TABLE 1-continued

Crystal data and structure refinement for LiInP$_2$Se$_6$ at 293 K.

| | |
|---|---|
| Independent reflections | 437 [R$_{int}$ = 0.0438] |
| Completeness to θ = 25.242° | 98.6% |
| Refinement method | Full-matrix least-squares on F$^2$ |
| Data/restraints/parameters | 437/0/17 |
| Goodness-of-fit | 1.335 |
| Final R indices [I > 2σ(I)] | R$_{obs}$ = 0.0277, wR$_{obs}$ = 0.0592 |
| R indices [all data] | R$_{all}$ = 0.0361, wR$_{all}$ = 0.0616 |
| Extinction coefficient | |
| Largest diff. peak and hole | 0.680 and −0.835 e·Å$^{-3}$ |

Figure 2:
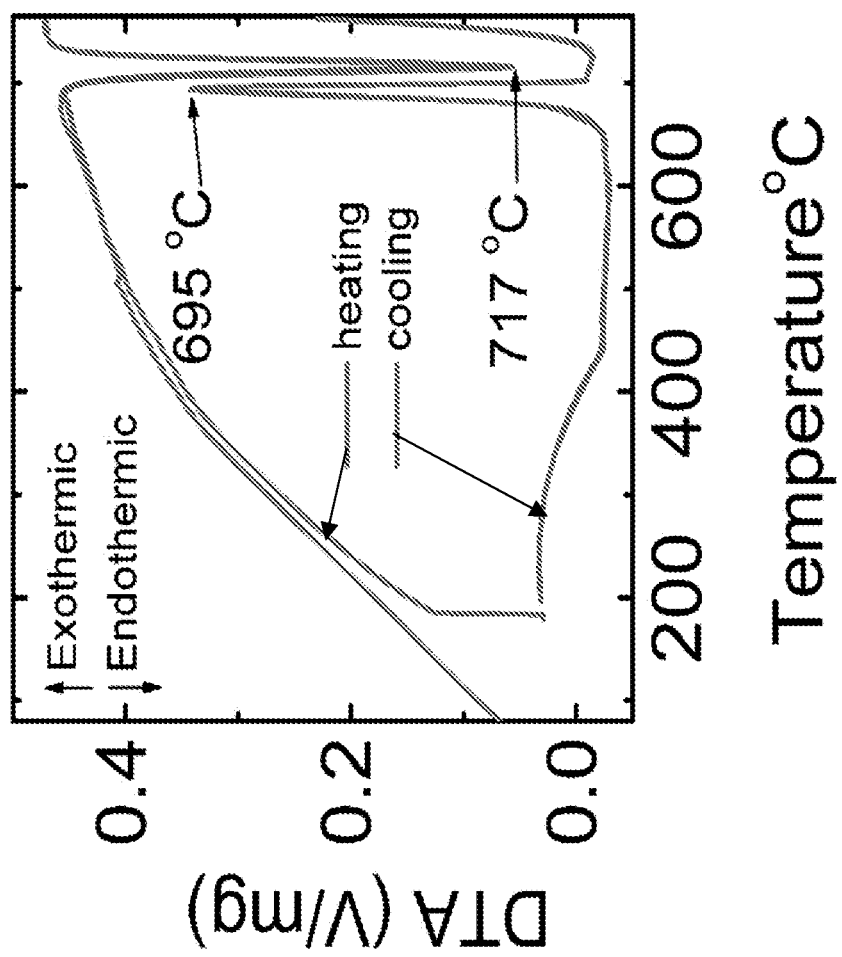
FIG. 2 shows the differential thermal analysis (DTA) measurement of LiInP$_2$Se$_6$, demonstrating a single melting and recrystallization event typical of a congruent melting material.

$R = \Sigma||F_o| - |F_c||/\Sigma|F_o|$, $wR = \{\Sigma[w(|F_o|^2 - |F_c|^2)^2]/\Sigma[w(|F_o|^4)]\}^{1/2}$ and $w = 1/[\sigma^2(Fo^2) + (0.0302P)^2 + 0.0582P]$ where $P = (Fo^2 + 2Fc^2)/3$ The congruent melting character of LiInP$_2$Se$_6$ was confirmed based on the DTA measurement. The melting and crystallization points of LiInP$_2$Se$_6$ were 717° C. and 695° C., respectively (FIG. 2). Because a single thermal event upon heating or cooling was present and the powder X-ray diffraction (PXRD) pattern after DTA showed only LiInP$_2$Se$_6$ present, congruent melting behavior was concluded. The material grown from CVT had essentially the same thermal events as the bulk, thus confirming the purity of the transported material. The structurally similar compound In$_4$(P$_2$Se$_6$)$_3$ could have potentially formed during CVT reactions, as those three elements were present. However, this compound melts incongruently at 607° C., and there was no peak at this temperature in the DTA measurement to suggest this compound was present. (See. e.g., Voroshilov, Y. V., et al., *Inorg. Mater.* 1991, 27, 2141-2144.) The melting point of LiInP$_2$Se$_6$ is considerably smaller than that of LiInSe$_2$ (m.p.~915° C.). (See, e.g., Tupitsyn, E., et al., *J. Cryst. Growth* 2014, 393, 23-27.) The reduction of the melting point has several benefits, including reduction of thermally activated defects and improved stoichiometry from reduced evaporative losses.

The optimized synthesis for LiInP$_2$Se$_6$ involved a relatively small excess of Li/P/Se to synthesize phase pure material confirmed by PXRD as seen in FIG. 3A and FIG. 3B. When a stoichiometric ratio of reagents was used, secondary phases were present. The need for additional P and Se may stem from the imbalanced vapor pressure of different vapor components, which likely induces a P/Se rich atmosphere, leaving the melt deficient in these elements.

The PXRD pattern of LiInP$_2$Se$_6$ in FIG. 3A shows a significant preferred orientation along the <0 0 1>, i.e., the peaks with the largest intensity are the (0 0 2), (0 0 4), and (0 0 8) planes. This preferred orientation stems from the layered nature of this compound, which causes the layers to lie parallel to the sample holder. The simulated pattern with MD parameter=0.3 was the reference pattern used to compare with the experimental pattern. When the patterns are zoomed in closer to the baseline, the reflections with contributions from the h and k directions can be seen and match well with the simulated pattern (FIG. 3B).

Figure 4A:
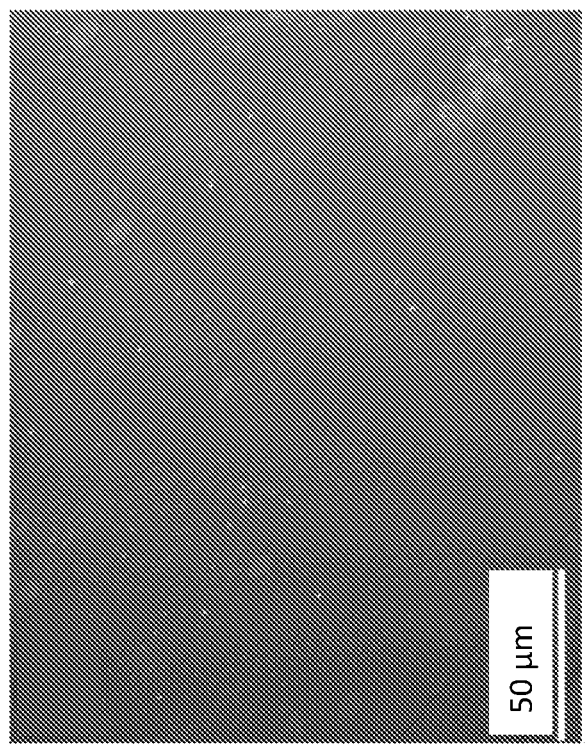
FIGS. 4A-4B show scanning electron microscope (SEM) images of LiInP$_2$Se$_6$ (FIG. 4A) of the basal plane and (FIG. 4B) a cross section of the layers.
Figure 4B:
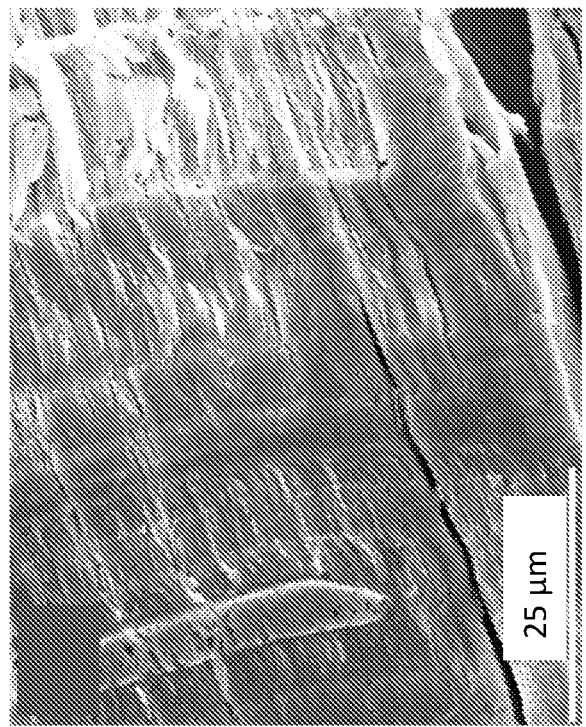

The lamellar morphology of the bulk ingot is indicated in SEM images (FIGS. 4A and 4B). A large flake with a smooth surface was selected to examine the surface of the basal plane. FIG. 4A shows a typical image of the smooth basal plane. The smoothness demonstrates this material's ability cleave along the van der Waals gaps. The composition from EDS from both orientations yielded the semi-quantitative formula In$_{1.1}$P$_{2.0}$Se$_{6.0}$, which is consistent with the expected ratio of 1:2:6 determined from the crystal structure. The lithium content could not be determined from EDS because of the insensitivity of EDS towards lithium.

In addition, bulk LiInP$_2$Se$_6$ shows good stability under ambient atmospheric conditions. However, when the ingot was finely ground, the resulting powder turned from bright orange to dark brown after several minutes of air exposure. Both the ingot and powder were very sensitive to liquid water and appeared to exfoliate after several seconds in water, potentially from water intercalating into the layers.

Initial vapor transport growth of LiInP$_2$Se$_6$ was carried out without involving iodine as a transporting agent. These reactions would only produce LiInP$_2$Se$_6$ in very small quantities (~1 mg) toward the middle-cold end of the tube after a few days of transport. At the cold side, a significant amount of amorphous P$_x$Se$_y$ was deposited, indicating that the material decomposed, liberating P and Se, which very effectively transported to the cold end. This issue was resolved by the use of iodine as a transporting agent, which allowed for the growth of large crystals with dimensions of ~1 cm×~1 cm×~0.05-0.5 mm after optimization. In a typical reaction, the larger crystals span the area of the tube, while the smaller crystals are localized on the wall, with a few of the smaller crystals growing on top of the larger crystals. The thickness of the thickest crystal in a single tube depends on the time allowed for transport and mass of source material. To limit the amount of nucleation sites, a reversal of the zones was employed to ensure that all LiInP$_2$Se$_6$ material was at the source side. The products of transport reactions without this first step are smaller crystals that are intergrown with each other on and near the surface of glass. The reversal of the hot and cold sides at the end of the reaction prevents the deposition of the gas phase species on to the surface of the crystals. Without this step, the contact between the electrodes and the surface of the crystal would be poor.

Because this system is a quinary system when considering the iodine, the gas-solid phase equilibria is rather complex. For a given material to transport, every element present in the material must have some species that favors the gas phase. Typically, metal selenides can be transported using iodine through the formation of M$^{n+}$In(g) and the Se dimer. Phosphorus can become gaseous by the formation of P$_4$ tetramers, though in the presence of iodine, PI$_3$ can form and transport phosphorus as well. In contrast, the transport of alkali metals is more difficult, as alkali metal compounds typically have low vapor pressures at moderate temperatures and thus transport poorly. For the transport of lithium, the reported gas phase species is (LiOH)$_2$, and this was likely the mechanism of Li transport in this reaction. This species would require the presence of water vapor for lithium to transport, which can be provided from the residual moisture left on the silica glass and water adsorption of the material.

Optical Properties.

Figure 5:
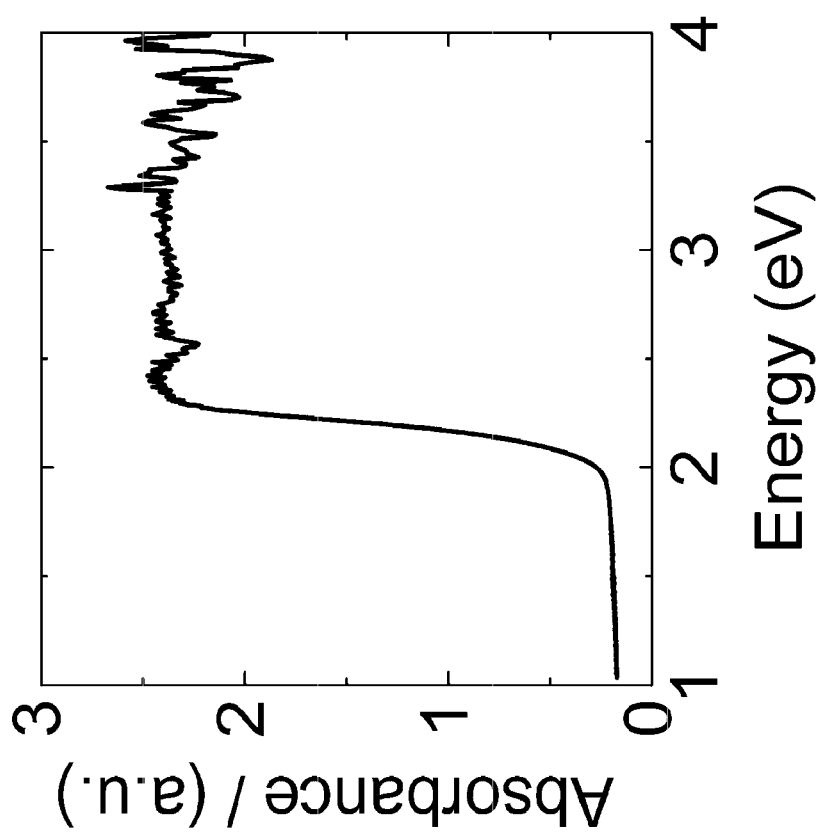
FIG. 5 depicts the absorbance spectrum of a LiInP$_2$Se$_6$ single-crystal.

The band gap of LiInP$_2$Se$_6$ determined from optical absorption measurements was 2.1 eV, as indicated in FIG. 5. This band gap value is suitable to reduce the thermal noise and thus obtain low dark current for room temperature operation, while maintaining sufficient carrier mobility. In comparison, LiInSe$_2$ has a larger band gap, 2.83 eV, which still allows for low dark current though the carrier mobility is quite lower. (See, e.g., Tupitsyn, E., et al., *J. Cryst. Growth* 2014, 393, 23-27.) UV-Vis-NIR transmission and reflection measurements on a LiInP$_2$Se$_6$ single-crystal were used to calculate its absorption. Using the Tauc plot for an indirect bandgap material, the bandgap of LiInP$_2$Se$_6$ is 2.1 eV, in keeping with its red color.

Plate-like crystals grown from CVT appear as thin, flat wafers, meaning that electrodes could be added without further processing. Evaporated gold was used as contacts for devices and was used to measure α-particle response due to a very small penetration length, on the order of micrometers.

Figure 6A:
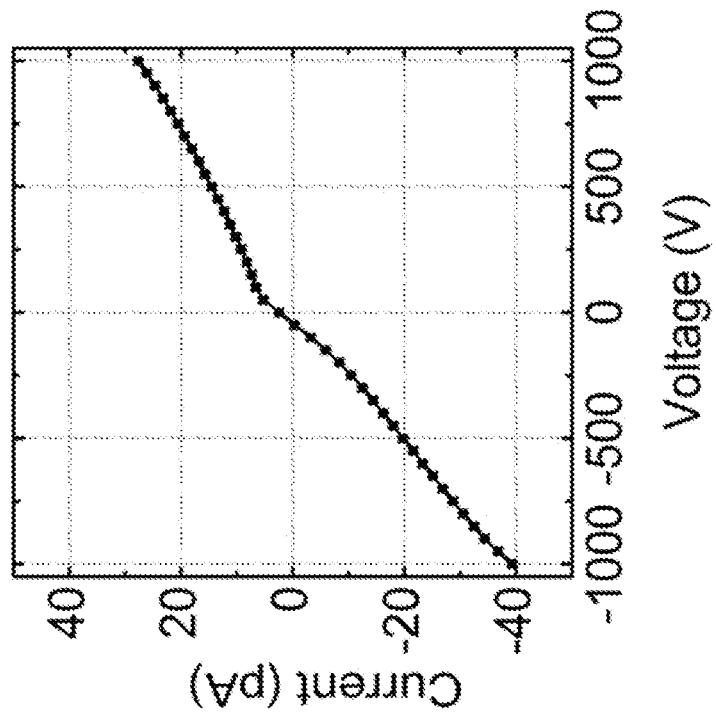
FIG. 6A shows a current-voltage (IV) plot of LiInP$_2$Se$_6$ grown from chemical vapor transport (CVT) with gold electrodes under illumination.
Figure 6B:
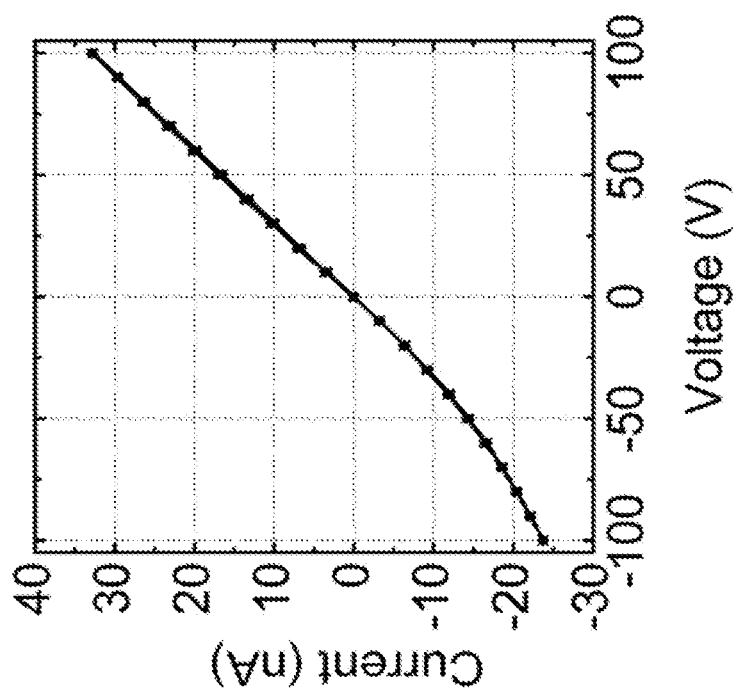
FIG. 6B shows an IV plot of LiInP$_2$Se$_6$ grown from CVT with gold electrodes without illumination.

As indicated in FIGS. 6A and 6B, the LiInP$_2$Se$_6$ detector demonstrates very low dark current and high photo response. The results from a pristine sample can be seen in FIG. 6A. These properties can differ from sample to sample, with the resistivity and photoresponse (photo current/dark current) varying from ~$10^{12}$-$10^{14}$ Ω·cm and 10-10000×. This variance in the electrical properties suggests that the number of defects in each crystal can vary significantly; nevertheless, the high resistivity and excellent photoresponse highlight the suitability of this compound as a semiconductor neutron detector material.

Figure 7B:
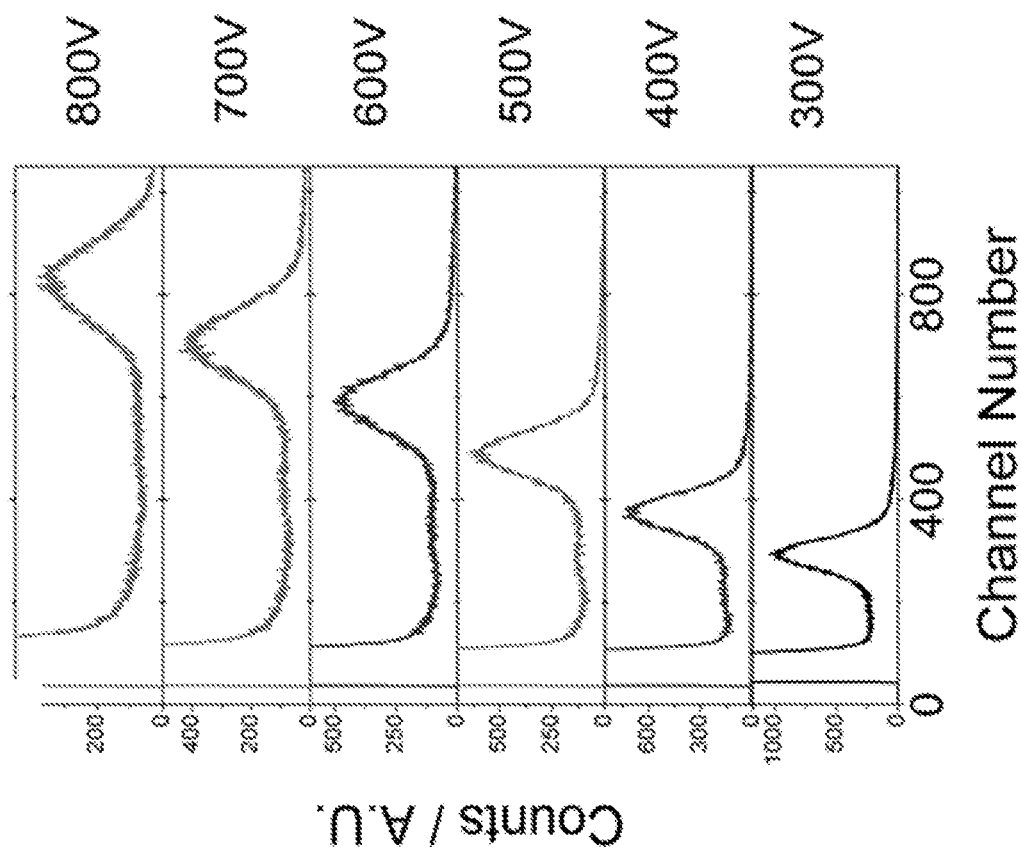
FIG. 7B depicts the pulse height spectrum of alpha-particles for a crystal with a thickness of 0.5 mm.
Figure 7A:
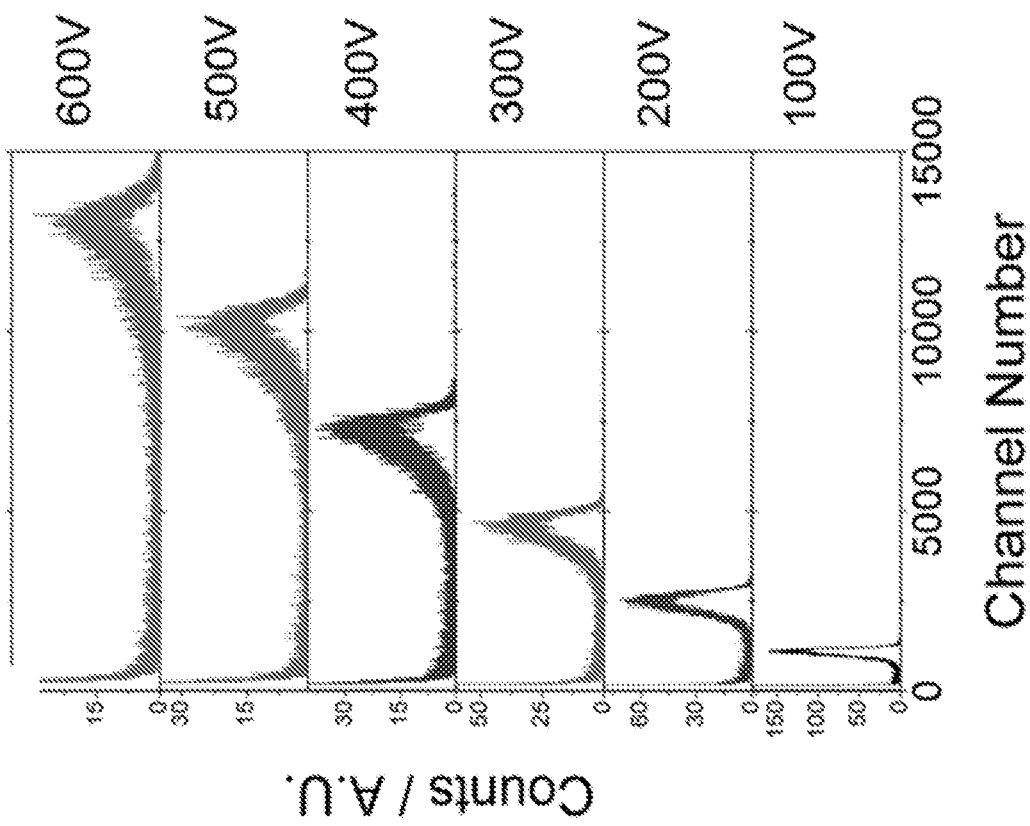
FIG. 7A depicts the pulse height spectrum of alpha-particles for a crystal with a thickness of 0.05 mm.

As a direct conversion semiconductor based on lithium, the neutron detection capability of LiInP$_2$Se$_6$ is based on the nuclear reaction from neutron capture of a $^6$Li nuclei as follows: n+$^6$Li=$^4$He+$^3$H (Q-value=4.78 MeV). Thus, the interaction of alpha-particles produced from the decay of $^{241}$Am (Q-value=5.4-5.5 MeV) can mimic the energy pulse of a neutron capture event. LiInP$_2$Se$_6$ demonstrates a fully resolved response to an $^{241}$Am α-particle, seen in FIGS. 7A and 7B, for crystals with thickness of 0.05 mm and 0.5 mm. The channel number is a measure of the charge collection efficiency and is directly proportional to incident energy. For both detectors, the peak from the interaction of alpha-particles shifts to a higher channel number with increasing voltage, as expected, because more charge will be collected with higher applied field. However, the peak for the thinner crystal was at significantly higher channel numbers than the thicker sample, implying charge collection was more efficient in the former. The larger applied field appears to be the main reason for the higher channel number of the thinner sample's α-particle peak. For the thicker sample, there was a significant amount of signal in the region between the peak and the background edge, potentially from regions of defects resulting in incomplete charge collection.

The figure of merit for charge transport in a semiconductor detector is the mobility-lifetime product, known as the quantity $\mu\tau$. For reliable neutron detection, the $\mu\tau$ must be large enough so that counts from neutron capture are at a sufficiently high channel number to be distinct enough from the background to allow accurate discrimination. The Hecht equation for a single carrier type is a common way to estimate $\mu\tau$, as seen below:

$$CCE = \frac{(\mu\tau)_e V}{d^2}\left[1 - \exp\left(\frac{d^2}{(\mu\tau)_e V}\right)\right]$$

(See. e.g., Sellin, P. J., et al., *IEEE Trans.* 2005, 52 (6), 3074-3078.)

Figure 8B:
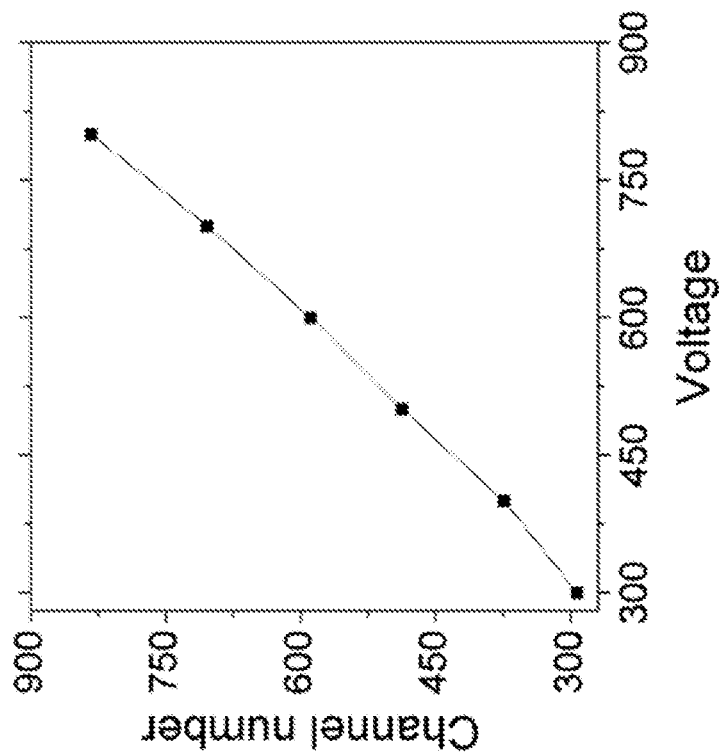
FIG. 8B shows channel number vs. voltage for a crystal with a thickness of 0.5 mm. The line is a guide for the eye.
Figure 8A:
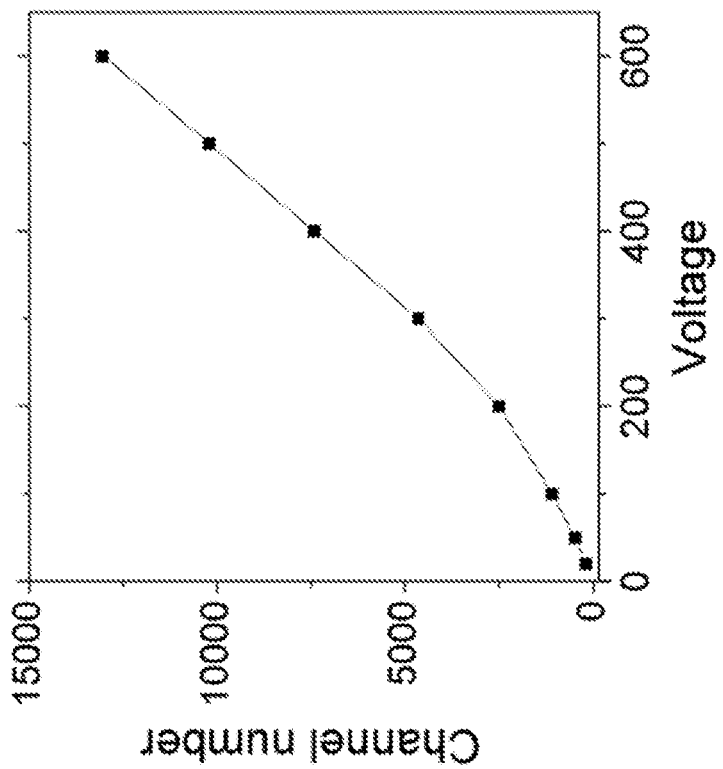
FIG. 8A shows channel number vs. voltage for a crystal with a thickness of 0.05 mm.

However, this equation cannot model the channel number vs. voltage data for LiInP$_2$Se$_6$, as shown in FIGS. 8A and 8B, because the model assumes linear behavior at low voltages which then saturate towards a certain channel number as CCE reaches a maximum, while the data follows a different trend. The thicker sample has a linear dependence, meaning no information about the saturation behavior is given, and an accurate fit cannot be made. The thinner sample has a relatively shallow slope for low voltages, which steepens at higher voltage and then remains linear, with no saturation of the CCE. This slope shift in the linear region can be explained by the reduction of the effective voltage from an internal polarization antiparallel to the applied field. This atypical behavior has been observed in the alpha-particle response of CZT at T=200K. This effect may be attributed to polarization from deep level traps.

Figures 9, 10:
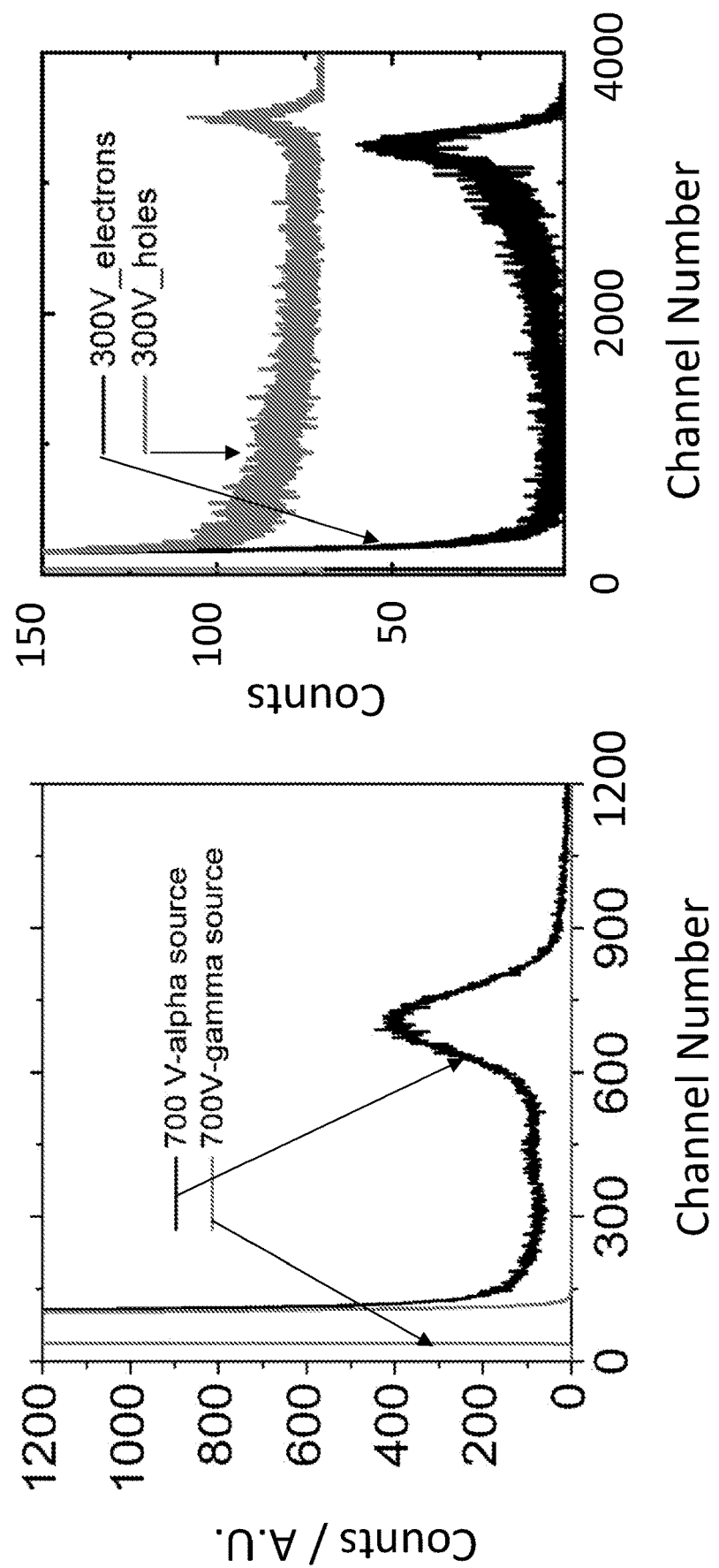
FIG. 9 depicts the pulse height spectrum of a 0.5 mm sample illuminated with an $^{241}$Am α-source (black) and with $^{57}$Co γ-ray source (grey).
FIG. 10 depicts the pulse height spectrum of LiIn$_{0.999}$Cd$_{0.001}$P$_2$Se$_6$ for electrons and holes for a 0.1 mm thick crystal.

The pulse height spectrum was collected when exposed to only gamma radiation on the thicker sample to test for gamma ray discrimination, as seen in FIG. 9. The background and gamma ray spectra were almost identical, demonstrating the high gamma ray discrimination of this material.

In addition to the semiconducting properties, another aspect of neutron detection that must be considered is the neutron stopping power of the material. Ideally, virtually all neutrons that are incident to the detector would be collected. The linear attenuation coefficient can be used to quantify the number of neutrons absorbed through the following equation:

$$\% \text{ of neutrons captured} = (1-e^{-l\alpha}) \times 100\%,$$

where l is the thickness, and α is the linear attenuation coefficient. The linear attenuation coefficient can be calculated by considering the microscopic capture cross-section and molar density. Considering the equation above, the number of neutrons collected can be enhanced by using thicker detectors and/or increasing α through isotopic enrichment. For the case of LiInP$_2$Se$_6$, the thickest wafer that was synthesized using CVT was ~1 mm. LiInSe$_2$ has approximately double the neutron stopping power of LiInP$_2$Se$_6$. Therefore, use of $^6$Li would increase the neutron stopping power. Indium of natural abundance has a significant neutron capture cross section (167 barns). However, neutron capture from indium does not produce high-energy capture products, thus reducing the signal. For wafers of ~1 mm thickness, about ⅓ of the neutrons would interact with lithium and be converted to useable signal.

Example 2

In this example, cadmium-doped LiInP$_2$Se$_6$ was synthesized by the following method: In (9.9902 g) and Cd (0.0098 grams) were loaded into a 13-mm fused silica tube. The molar ratio of Cd to In was 1:999. The tube was placed under vacuum (~3×10$^{-3}$ mBar) and then flame sealed using an oxy/natural gas torch. The tube was placed in a vertical tube furnace, and the following heating profile was used: Heat to 350° C. in 5H, soak for 48 H, and then air quench.

The procedure for the bulk synthesis of LiInP$_2$Se$_6$ was identical to the one for undoped LiInP$_2$Se$_6$ in Example 1, except where Example 1 called for indium metal, pure indium metal was replaced with In$_{0.999}$Cd$_{0.001}$. The procedure for crystal growth using CVT was identical to that of undoped LiInP$_2$Se$_6$ in Example 1.

Results and Discussion

The pulse height spectrum for electrons for LiIn$_{0.999}$Cd$_{0.001}$P$_2$Se$_6$ can be seen in FIG. 10. The full energy peak of the alpha particle can be fully resolved for both electron and hole collection. In addition to the full energy peak for the hole collection, there is a shallow shoulder coming from the background which stems from regions of incomplete charge collection, suggesting that the defect concentration might not be uniform. For undoped LiInP$_2$Se$_6$, the full energy peak cannot be resolved for hole collection. For electron collection, there is a shoulder on the left side of the full energy peak also from incomplete charge collection in certain regions, though not as incomplete as for hole collection.

Example 3

This example describes the synthesis, alpha-particle response, and neutron response of $^6$LiInP$_2$Se$_6$.

Synthesis of $^6$LiInP$_2$Se$_6$

The reagents $^6$Li$_{1.03}$In, P$_2$Se$_5$, and Se were used to synthesize $^6$LiInP$_2$Se$_6$. Li$_{1.03}$In was prepared using the following method: In an argon box, 0.1281 g of $^6$Li chunks and 2.3719 g of In pieces were loaded into an amorphous carbon crucible. This crucible was loaded into a fused silica tube. The tube was evacuated to a pressure of ~3×10$^{-3}$ millitorr and then flame sealed. The tube was then placed into an upright tube furnace and subjected to the following heating profile: Heat to 700° C. in 10 hours, soak for 12 hours, and then cool to room temperature in 6 hours. The $^6$Li$_{1.03}$In alloy was removed from the glassy carbon crucible and stored in a nitrogen glove box. P$_2$S was synthesized in the same manner as described in Example 1.

$^6$LiInP$_2$Se$_6$ was synthesized using the following method: 2.400 g of Li$_{1.03}$In, 9.330 g of P$_2$Se$_5$, and 1.613 g of Se were loaded into a carbon-coated, 2-mm thick, fused silica tube. The tube was flame sealed under ~3×10$^{-3}$ millitorr of pressure. The tube was loaded into a tilted tube furnace and then subjected to the following heating profile: Heat to 750° C. in 10 hours, soak for 24 hours, cool to 350° C. in 12 hours, then turn off furnace and allow to cool to room temperature.

Crystal Growth of $^6$LiInP$_2$Se$_6$

Single-crystals of $^6$LiInP$_2$Se$_6$ were prepared using the same chemical vapor transport procedure described in Example 1 for the unenriched LiInP$_2$Se$_6$.

Device Fabrication

Devices using $^6$LiInP$_2$Se$_6$ single-crystals were prepared in the same manner as the devices that used unenriched LiInP$_2$Se$_6$ single-crystals in Example 1.

Alpha Particle Response

Figure 11:
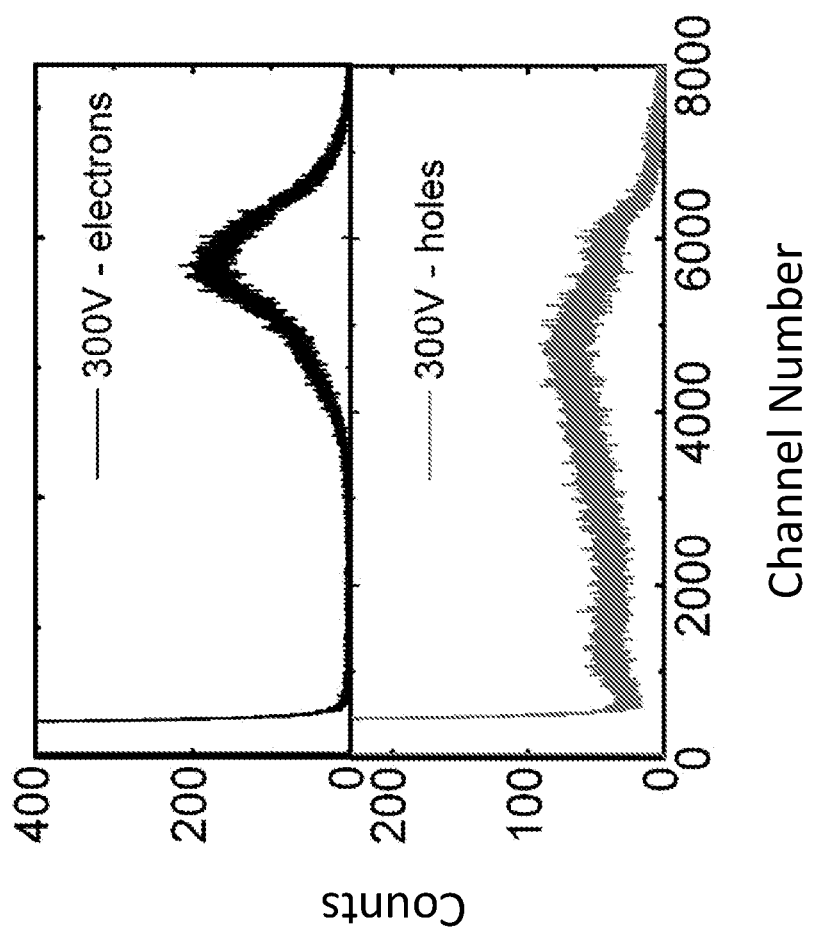
FIG. 11 depicts the pulse height spectrum of an $^{241}$Am alpha particle from electron and hole collection.

The alpha particle energy spectrum was collected in the same manner as for that of unenriched LiInP$_2$Se$_6$ material, as described in Example 1. The pulse height spectrum for a sample with a contact area of 7×7 mm$^2$ and approximately 50 µm can be seen in FIG. 11.

For electron collection, a full energy peak was obtained. In contrast, the hole collection did not yield a peak, suggesting lower charge collection efficiency when holes are collected.

Neutron Response

Figure 13:
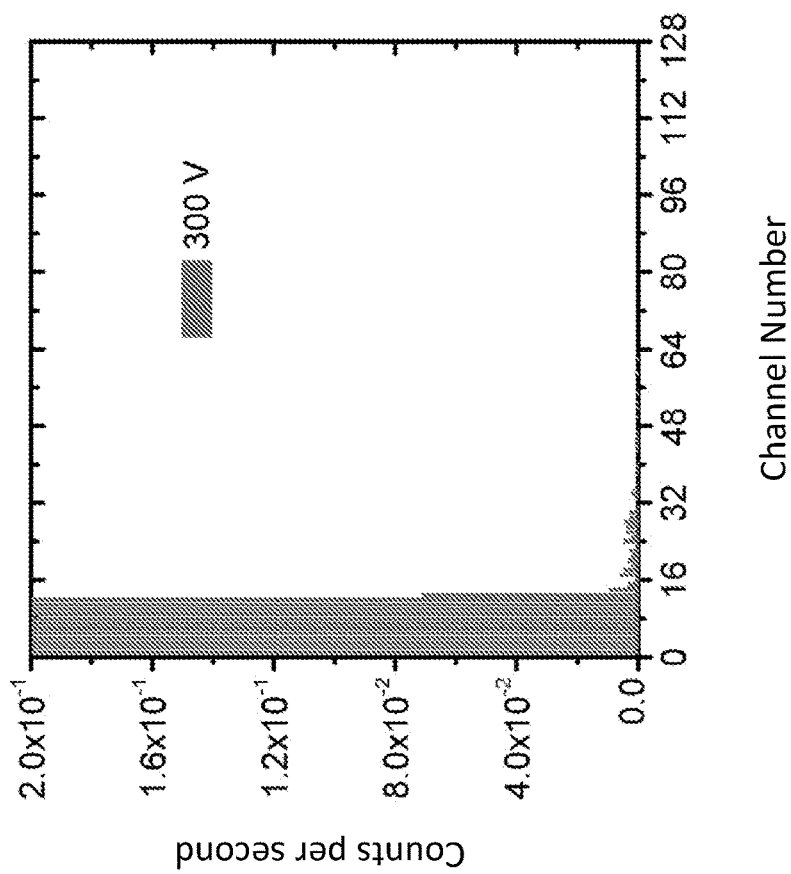
FIG. 13 depicts the pulse height spectrum of the neutron response of a $^6$LiInP$_2$Se$_6$ device shielded with 1/16 inch of Cd foil.
Figure 12:
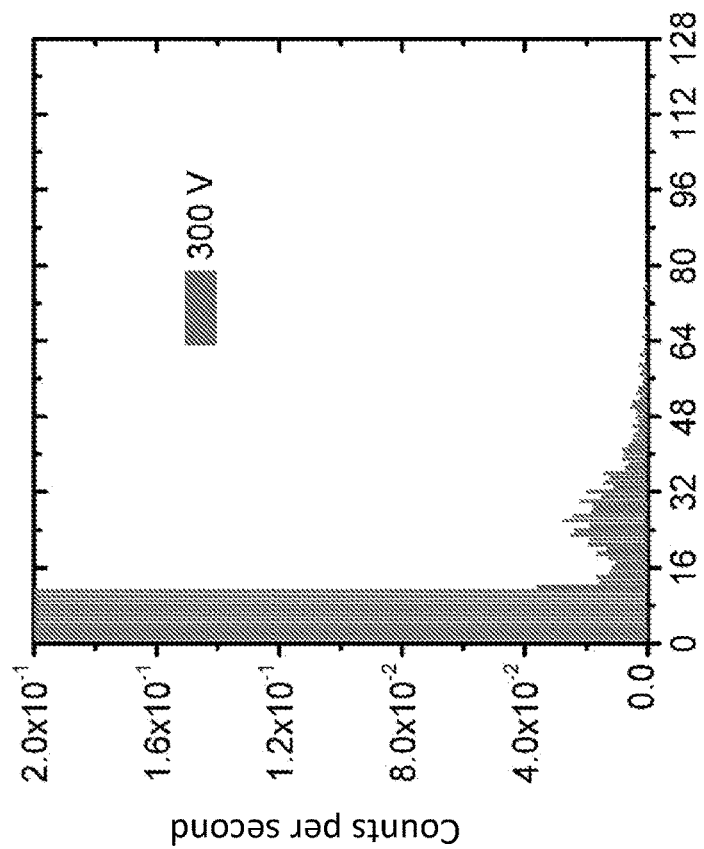
FIG. 12 depicts the pulse height spectrum of the neutron response of a $^6$LiInP$_2$Se$_6$ device.

The same electronics setup that was used to collect the alpha particle spectrum was used to collect the neutron spectrum. A moderated PuBe source was used as a source of thermal neutrons. The neutron flux at the window of the source was approximately 200 neutrons/s/cm$^2$. The acquisition time was 30 minutes because the count rate was very low. The channel numbers were binned to reduce the number of channels from 16384 to 128. The cutoff for the neutron signal was set at channel number 16. The neutron spectrum without and with $^1$⁄$_{16}$-inch cadmium foil shielding can be seen in FIGS. 12 and 13, respectively.

The counting rate was reduced from 0.475 to 0.064 counts/second when the cadmium foil shielded the detector. This large reduction in count rate means the counts were from neutron capture events, as cadmium absorbs a significant number of thermal neutrons. The intrinsic efficiency of this device was ~0.5% when normalized for area.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for detecting thermal neutrons or alpha particles, the method comprising:
   applying an electric field across a single-crystal of a lithium-containing chalcophosphate compound having the formula LiMP$_2$Q$_6$, where M is Ga, In, Bi, Sb, As, Al, or a combination thereof, and Q is S, Se, or a combination thereof;
   exposing the single-crystal to incident neutrons or alpha particles, wherein the single-crystal absorbs incident neutrons or alpha particles, resulting in the generation of an electrical signal; and
   detecting the electrical signal.

2. The method of claim 1, wherein the Li comprises $^6$Li.

3. The method of claim 1, wherein the compound is a quaternary compound.

4. The method of claim 3, wherein the compound is doped with an external dopant.

5. The method of claim 4, wherein the compound has the formula LiIn$_x$M$_{1-x}$P$_2$Se$_6$, where M is the external dopant and x has a value in the range from 0.00001 to 0.05.

6. The method of claim 5, wherein the compound is LiIn$_x$Cd$_{1-x}$P$_2$Se$_6$, where Cd is the dopant and x has a value in the range from 0.00001 to 0.03.

7. The method of claim 3 having the formula LiInP$_2$Se$_6$.

8. The method of claim 7, wherein the Li comprises $^6$Li.

* * * * *